United States Patent [19]
Groen et al.

[11] Patent Number: 5,411,924
[45] Date of Patent: May 2, 1995

[54] CERAMIC BODY

[75] Inventors: Wilhelm A. Groen; Marcellinus J. Kraan; Gijsbertus De With, all of Eindhoven, Netherlands

[73] Assignee: U.S. Philips Corporation, New York, N.Y.

[21] Appl. No.: 196,938

[22] Filed: Feb. 15, 1994

[30] Foreign Application Priority Data

Feb. 18, 1993 [EP] European Pat. Off. ............ 93200467

[51] Int. Cl.$^6$ ............................................ C04B 35/58
[52] U.S. Cl. ...................................... 501/97; 501/122; 501/96; 264/65
[58] Field of Search ............................ 501/97, 122, 96; 264/65

[56] References Cited

FOREIGN PATENT DOCUMENTS 50-30600  10/1975  Japan .

OTHER PUBLICATIONS

"Structure De MgSiN2 Et MgGeN2" Jean David et al, Bull. Soc. Fr. Mineral Cristallogr. 93 153-159 (1970), No month.

"Preparation of a New Ternary Lithium Silicon Nitride, LiSi2n3, and the High Pressure Synthesis of Magnesium Silicon Nitride NgSiN2" E. D. Whitney et al, Inorganic Chemistry, vol. 10, No. 5, 1971 pp. 1090-1092, no month.

Whitney et al "Chem Abstracts", vol. 75, 1971, 104581e no month.

Uchida et al "J. Am. Ceram. Soc. " 68(2), C–38–C–40 (1985) no month.

*Primary Examiner*—Mark L. Bell
*Assistant Examiner*—C. Bonner
*Attorney, Agent, or Firm*—Norman N. Spain

[57] ABSTRACT

The invention provides a ceramic body and a method of manufacturing such a body. The body is characterized by its composition, which comprises 20-30 at. % of magnesium, 20-30 at. % of silicon, 40-60 at. % of nitrogen and maximally 15 at. % of oxygen. A preferred composition corresponds to the formula $MgSiN_{2-x}O_x$, where x is smaller than 0.5. The manufacture of the ceramic body in accordance with the invention is simpler and cheaper than that of aluminium nitride, and a number of properties of said ceramic material are better than those of the known aluminium oxide.

8 Claims, 1 Drawing Sheet

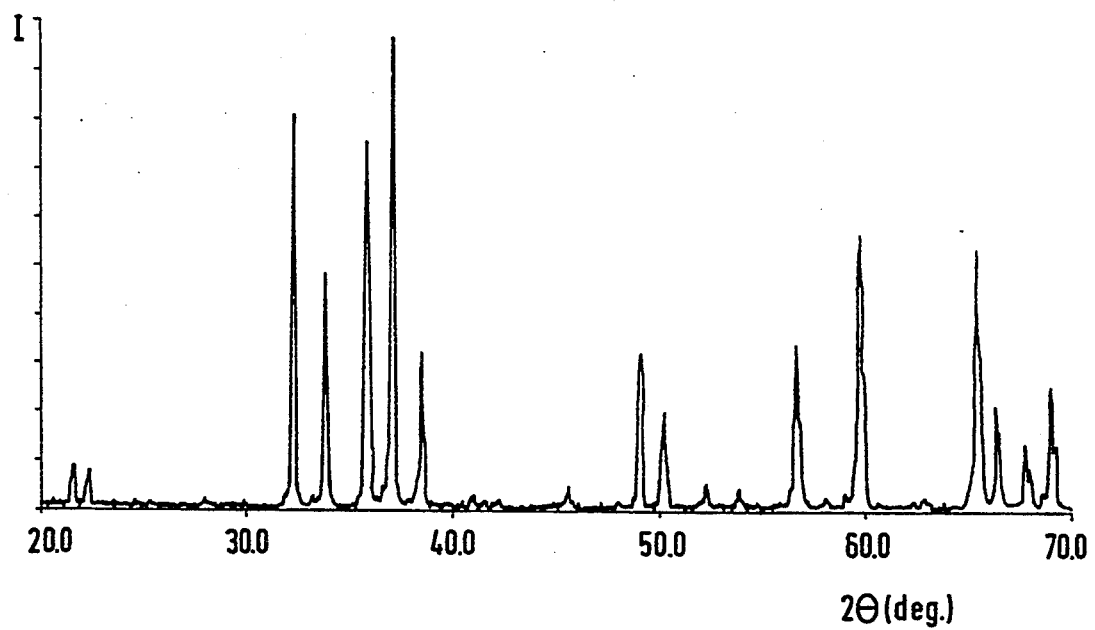

CERAMIC BODY

BACKGROUND OF THE INVENTION

The invention relates to a ceramic body. The invention also relates to a method of manufacturing a ceramic body.

Ceramic bodies have particular properties rendering them suitable for many applications. For example, ceramic bodies in the form of blocks or rods are available, for example, for use as refractory materials. A very important further use of ceramic bodies is their application as carriers or substrates. These substrates generally consist of a thin layer of sintered ceramic material, such as aluminium oxide ($Al_2O_3$), magnesium oxide (MgO), beryllium oxide (BeO), aluminium nitride (AlN) or silicon carbide (SIC). By virtue of their favourable electrically insulating properties such substrates are used in passive and active electrical components, such as resistors, capacitors, transformers and power transistors.

The known ceramic bodies generally exhibit a combination of a number of favourable and a number of unfavourable properties. For example, substrates of relatively impure aluminium oxide and magnesium oxide have the advantage that they are cheap. However, such substrates exhibit a rather poor heat conduction. Due to this poor heat conduction they are unsuitable for use as substrate material in electrical components in which a high development of heat occurs, which heat must be dissipated via the substrate. A further disadvantage of these oxidic ceramic materials is that they have a relatively high coefficient of expansion, rendering them less suitable for a number of applications, in particular in the field of silicon semiconductor technology. The coefficient of expansion of silicon ranges from 4 to 5.

Beryllium oxide, aluminium nitride and silicon carbide have a much higher heat conduction than aluminium oxide and magnesium oxide and, hence, can more suitably be used as a heat-dissipating substrate or 'heat sink' of an electrical component. In addition, ceramic bodies of aluminium nitride and silicon carbide have a coefficient of expansion which corresponds more to that of silicon, so that they are more suitable for use as substrates in the silicon semiconductor technology. However, the ceramic aluminium nitride technology is difficult due to the poor reproducibility and problems relating to purity. As a result, ceramic substrates of pure aluminium nitride are relatively expensive. Ceramic substrates of silicon carbide are also relatively expensive because the material is difficult to process. In addition, ceramic silicon carbide has a relatively high dielectric constant, so that this material is relatively unsuitable for use as a substrate in electrical components. Finally, ceramic bodies of beryllium oxide have the important disadvantage that they are toxic.

SUMMARY OF THE INVENTION

It is an object of the invention to provide a ceramic body which combines a relatively good heat conduction with a relatively simple and inexpensive process technology. The intended ceramic body should exhibit, on the one hand, a considerably higher heat conduction and a lower coefficient of expansion than impure aluminium oxide and magnesium oxide. On the other hand, the manufacture of the intended ceramic body must be simpler and considerably cheaper than that of ceramic aluminium nitride. The ceramic body in accordance with the invention must further have a relatively low dielectric constant.

These and other objects of the invention are achieved by a ceramic body which is characterized according to the invention in that the body comprises 20-30 at. % of magnesium, 20-30 at. % of silicon, 40-60 at. % of nitrogen and maximally 15 at. % of oxygen.

In comparison with the customary aluminium oxide and magnesium oxide, a ceramic body of the above composition has a relatively high heat conduction. Further, the coefficient of expansion of the inventive material is much lower than that of the said oxidic ceramic bodies. The manufacture of the material in accordance with the invention is very reproducible and, in comparison with aluminium nitride and silicon carbide, relatively inexpensive. In contrast with aluminium nitride, the ceramic body in accordance with the invention further exhibits a satisfactory resistance to superalkaline solutions. The inventive ceramic body further exhibits a relatively low rigidity, a good resistance to thermal shocks and a relatively low dielectric constant.

In addition to the above-mentioned constituent elements Mg, Si, N and O, the ceramic body in accordance with the invention may comprise other elements, such as Ca and Be. The mechanical and electrical properties of the ceramic body can be influenced by incorporating relatively small quantities of said elements. It has been found, however, that in ceramic bodies which comprise less than 20 at. % or more than 30 at. % of magnesium or silicon, the quantity of different-phase material is so large that the mechanical and electrical properties of such ceramic bodies are unacceptably bad. If the oxygen content in the ceramic body is in excess of 15 at. %, the heat conduction is insufficient for the intended application.

A preferred embodiment of the ceramic body in accordance with the invention is characterized in that the composition of the body corresponds to the formula $MgSiN_{2-x}O_x$, where x is smaller than 0.5. Ceramic bodies of this composition exhibit the highest heat conduction. This can be attributed to the absence of heterogeneous dopants in the ceramic body, which promote the formation of poorly heat-conducting side phases. A small deviation from the ratio Mg:Si:N+O=1:1:2 is possible per se due to the presence of small quantities of second phase on the grain boundaries. However, the deviation from the stoichiometric composition never exceeds 5 at. % per element. It is assumed that ceramic materials having such a small deviation from the stoichiometric ratio satisfy the composition of the said formula.

It has been found that the quantity of oxygen present in the ceramic body is inversely proportional to the heat conduction of said body. Therefore, the aim is to minimize the quantity of oxygen in the ceramic body. Preferably, the ceramic body contains less than 10 at. % of oxygen. An even higher heat conduction is attained if the ceramic body in accordance with the invention contains less than 5 at. % of oxygen.

The invention also relates to methods of manufacturing a ceramic body. A first method is characterized in that a magnesium-silicon-nitride powder comprising 20-30 at. % of magnesium, 20-30 at. % of silicon, 40-60 at. % of nitrogen and maximally 15 at. % of oxygen is densified into a moulded product which is subsequently sintered into a ceramic body in an inert atmosphere at a temperature in the range from 1400°-1600° C. A second method is characterized in that a magnesium-silicon-nitride powder comprising 20–30 at. % of magnesium, 20–30 at. % of silicon, 40–60 at. % of nitrogen and maximally 15 at % of oxygen is hot-pressed at a temperature in the range from 1400°–1600° C. A preferred embodiment of this inventive method is characterized in that the composition of the powder corresponds to the formula $MgSiN_{2-x}O_x$, where x is smaller than 0.5. It is noted that the preparation of a powder of $MgSiN_2$ as well as the crystal structure of this compound are known per se from Bull. Soc. fr. Mineral. Cristallogr. 93 153–159 (1970).

It has been found that ceramic bodies manufactured by the method in accordance with the invention are substantially completely densified in the sintering process. The relative density of the ceramic bodies is 95% or more. By means of (isostatic) pressing or colloidal filtration the powder can be densified into a moulded product. Preferably argon is used as the inert gas. The ceramic body in accordance with the invention is preferably in the form of a substrate. The highest densities are obtained by hot-pressing, which yields densities of 99% or more.

The invention will be explained in greater detail by means of an exemplary embodiment and the drawing, in which

BRIEF DESCRIPTION OF THE DRAWING

The sole Figure shows an X-ray diffraction pattern of a ceramic body in accordance with the invention.

DETAILED DESCRIPTION OF THE PREFERRED EMBODIMENTS

A stoichiometric mixture of $Mg_3N_2$ powder (Cerac, 99.9% pure) and amorphous $Si_3N_4$ powder (Sylvania, Sn 402) were thoroughly mixed and subsequently placed in an aluminium oxide crucible. The crucible was properly closed to preclude evaporation of $Mg_3N_2$. The crucible including its contents was subjected to a thermal treatment under a nitrogen atmosphere for 16 hours at 1250° C. After cooling, the mixture was ground in a ball mill, while excluding oxygen, until an average particle size of the material of approximately 1 micrometer was obtained. From the X-ray diffraction pattern (not shown) it could be derived that the powder consisted of substantially pure single-phase $MgSiN_2$, in which a small quantity of MgO and $\alpha$-$Si_3N_4$ were present as side phases. The presence of oxygen is probably caused by contamination of the amorphous $Si_3N_4$.

By means of densification, the powder was convened into moulded products. Two densification methods were used. In accordance with the first method, a pellet having a thickness of 30 nm and a cross-section of 6 nm was manufactured. In this method, a quantity of powder was isostatically compressed in two steps at a pressure of 5 and 200 MPa, respectively, at room temperature. The density of the moulded product was 50% of the theoretically maximum density. In accordance with a second method, a thin substrate having a thickness of 2 mm was manufactured. In this method a quantity of the powder obtained was dispersed in alcohol after which the dispersion was dram off on to a filter. The layer thus formed was subsequently dried at a relatively high temperature and sub-atmospheric pressure. The density of the moulded product was approximately 50% of the theoretically maximum density.

The moulded products thus manufactured were placed in an Mo crucible which further contained a quantity of the above-mentioned powder. The crucible was then filled with argon and closed. Subsequently, the crucible was heated for 5 hours to a temperature of 1550° C. and subsequently cooled. The warming-up rate was 1000° C. and the cooling rate was 200° C.

The composition of the sintered moulded products was subsequently determined by means of an element analysis. The composition corresponded to the formula $Mg_{1.00}Si_{0.97}N_{1.77}O_{0.19}$. The density of the ceramic body was 3.11 g/cm³. On the basis of a calculated theoretically maximum density of 3.128 g/cm³, this means that the ceramic body in accordance with the invention had a density of 99.4%.

In another experiment a ceramic body of $MgSiN_2$ was manufactured by means of hot-pressing. In this experiment the same powder as in the above-mentioned experiments was used. This powder was introduced into a hot press (HF20; Thermal Technology Ind.) comprising a graphite mould. Sintering was preformed by pressing the powder at a temperature in the range from 1400°–1600° C. under a pressure of 75 MPa for 2 hours. The density of the sintered material was 99.6% of the theoretically maximum density.

The X-ray diffraction spectrum of a ceramic body in accordance with the invention is shown in the Figure. From this spectrum it can be derived that the ceramic body was substantially monophase and that a small quantity of $Mg_2SiO_4$ and $\beta$-$Si_3N_4$ was present in the ceramic body. The quantity thereof was less than 5 at. %.

TABLE

|  | $MgSiN_2$ | $Al_2O_3$ | AlN |
| --- | --- | --- | --- |
| $\sigma$(MPa) | 240–270 | 450 | 340 |
| E(GPa) | 235 | 398 | 315 |
| $\nu$ (–) | 0.232 | 0.235 | 0.245 |
| $\alpha$ ($10^{-6}$ K$^{-1}$) | 5.8 | 7.9 | 4.8 |
| $\kappa$ (W/m · K) | 17 | 10 | 150 |
| R (K) | 130–150 | 110 | 170 |
| R' (kW/m) | 2.2–2.5 | 2.2 | 2.5 |
| $K_{1c}$(MPa-m$^{\frac{1}{2}}$) | 3.2–4.3 | 4–5 | 2.7 |
| H(GPa) | 14.2–15.9 | 19.5 | 12 |

In addition to properties of the known ceramic materials aluminium oxide and aluminium nitride, the Table also lists a number of properties of the ceramic body in accordance with the invention. The measured properties relate to the strength $\sigma$, the Young's modulus E, the transverse contraction constant $\upsilon$, the thermal coefficient of expansion $\alpha$, the coefficient of thermal conduction k, the resistance to fracture or tearing strength $K_{1c}$, and the hardness H. The parameters R and R' are defined by $R=(1-\upsilon)\sigma/E.\alpha$ and $R'=k.R$. These parameters indicate the thermal shock resistance to substantial heat transfer (R) and moderate heat transfer (R'), respectively.

Consequently, the ceramic body in accordance with the invention combines a number of satisfactory properties. On the one hand, the coefficient of expansion of the body in accordance with the invention is lower than that of the cheap aluminium oxide. On the other hand, the processing of the ceramic body in accordance with the invention is simpler and cheaper than that of aluminium nitride.

We claim:

1. A ceramic body, comprising 20–30 at. % of magnesium, 20–30 at. % of silicon, 40–60 at. % of nitrogen and maximally 15 at. % of oxygen.

2. A ceramic body as claimed in claim 1, wherein the composition of the body corresponds to the formula $MgSiN_{2-x}O_x$, where x is smaller than 0.5.

3. A ceramic body as claimed in claim 1, wherein said body is a substrate.

4. A method of manufacturing a ceramic body comprising providing a magnesium-silicon-nitride powder comprising 20–30 at .% of magnesium, 20–30 at .% of silicon, 40–60 at .% of nitrogen and maximally 15 at .% of oxygen densifying said powder into a molded product and sintering said product into a ceramic body in an inert atmosphere at a temperature in the range from 1400°–1600° C.

5. A method of manufacturing a ceramic body comprising providing a magnesium-silicon-nitride powder comprising 20–30 at .% of magnesium, 20–30 at .% of silicon, 40–60 at .% of nitrogen and maximally 15 at .% of oxygen and hot pressing said powder at a temperature in the range from 1400°–1600° C. under a pressure sufficient to produce a ceramic body having a relative density greater than 95%.

6. A method as claimed in claim 3, characterized in that the composition of the powder corresponds to the formula $MgSiN_{2-x}O_x$, where x is smaller than 0.5.

7. A method as claimed in claim 5, wherein the composition of the powder corresponds to the formula $MgSiN_{2-x}O_x$, where x is smaller than 0.5.

8. A ceramic body as claimed in claim 1 wherein said body has a relative density of at least 95%.

* * * * *